(12) United States Patent
Baines et al.

(10) Patent No.: US 12,040,390 B2
(45) Date of Patent: Jul. 16, 2024

(54) ELECTRONIC COMPONENT WITH A HETEROJUNCTION PROVIDED WITH AN IMPROVED BURIED BARRIER LAYER

(71) Applicant: COMMISSARIAT A L'ENERGIE ATOMIQUE ET AUX ENERGIES ALTERNATIVES, Paris (FR)

(72) Inventors: Yannick Baines, Grenoble (FR); Pascal Scheiblin, Eybens (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 630 days.

(21) Appl. No.: 16/767,016

(22) PCT Filed: Nov. 26, 2018

(86) PCT No.: PCT/FR2018/052983
§ 371 (c)(1),
(2) Date: Dec. 9, 2020

(87) PCT Pub. No.: WO2019/106272
PCT Pub. Date: Jun. 6, 2019

(65) Prior Publication Data
US 2021/0126118 A1    Apr. 29, 2021

(30) Foreign Application Priority Data
Nov. 28, 2017  (FR) ..................................... 17 61295

(51) Int. Cl.
*H01L 29/778*  (2006.01)
*H01L 29/20*   (2006.01)

(52) U.S. Cl.
CPC ...... *H01L 29/7786* (2013.01); *H01L 29/2003* (2013.01)

(58) Field of Classification Search
CPC .................. H01L 29/7786; H01L 29/2003
See application file for complete search history.

(56) References Cited

U.S. PATENT DOCUMENTS

2010/0244041 A1 *  9/2010  Oishi .................. H01L 29/0688
                                              257/E29.091
2012/0138956 A1 *  6/2012  Shimizu ............ H01L 21/02507
                                                    438/479

(Continued)

FOREIGN PATENT DOCUMENTS

JP        2015115371 A  *  6/2015

OTHER PUBLICATIONS

International Search Report issued Mar. 26, 2019 in PCT/FR2018/052983 filed Nov. 26, 2018, citing documents AA-AC therein, 2 pages.

*Primary Examiner* — Jay C Kim
*Assistant Examiner* — Woo K Lee
(74) *Attorney, Agent, or Firm* — Oblon, McClelland, Maier & Neustadt, L.L.P.

(57) ABSTRACT

An electronic component includes a substrate; a stack of two layers of different semiconductor materials, designed to form a layer of electron gas at the interface thereof or close to same; and a buried barrier forming a separation between the substrate and said stack. The buried barrier includes a first layer of a ternary alloy of semiconductor material of the III-N type, having an increasing concentration of one of the chemical species of the ternary alloy of the first layer the closer it is to the substrate; and a second layer of a ternary alloy of semiconductor material of the III-N type, formed beneath the first layer and having a decreasing concentration of one of the chemical species of the ternary alloy of the first layer the closer it is to the substrate.

17 Claims, 5 Drawing Sheets

(56) References Cited

U.S. PATENT DOCUMENTS

| | | | |
|---|---|---|---|
| 2014/0374771 A1* | 12/2014 | Umeno | H01L 29/201 438/16 |
| 2020/0350426 A1* | 11/2020 | Fang | H01L 29/2003 |
| 2021/0082911 A1* | 3/2021 | Chiu | H01L 27/0694 |

* cited by examiner

ELECTRONIC COMPONENT WITH A HETEROJUNCTION PROVIDED WITH AN IMPROVED BURIED BARRIER LAYER

The invention relates to heterojunction electronic components equipped with a buried barrier layer separating them from their substrate, and in particular high-electron-mobility components equipped with such a buried barrier layer.

Many electronic applications will in the future require an improvement in performance, this above all being true in the on-board electronics intended for motor vehicles and land transportation, in aeronautics, in medical systems or in home automation solutions for example. These applications for the most part require high-power switches that are able to operate in frequency ranges frequently above one megahertz.

An alternative to power switches, notably at high frequencies, is the use of heterostructure field-effect transistors, and in particular high-electron-mobility field-effect transistors.

A high-electron-mobility transistor includes a superposition of two semiconductor layers having different bandgaps, which form a quantum well at their interface. Electrons are confined in this quantum well to form a two-dimensional electron gas. For reasons to do with the ability to resist high voltages and high temperatures, these transistors are chosen to have a wide energy bandgap.

Among wide-bandgap HEMTs, transistors based on gallium nitride are very promising. The width of their bandgap leads to a higher critical electric field compared to conventional electronic materials, to a high carrier saturation velocity and to good thermal and chemical stability. The breakdown field of gallium nitride may thus be higher than $2 \times 10^6$ V/cm, this easily allowing compact transistors with breakdown voltages higher than 600 V to be produced. With a transistor in which conduction is lateral, the gate/drain breakdown voltage may easily be controlled by a suitable distance between gate and drain. In addition, such transistors allow very high current densities to be achieved, because of the very high electron mobility and high electron density in the interface electron gas.

Such transistors are subject to current collapse. This effect degrades the performance of the transistor following an overvoltage. The degradation may be characterized by an increase in on-state resistance or by a shift in the threshold voltage of the transistor. Current collapse is due to trapping of carriers under an electric field, and may occur for various energies and in different locations in the transistor. In particular, such transistors have a tendency to trap electrons in deep layers, such as the buffer layer. Because of their electrostatic effect, such trapped electrons act as parasitic gates. These uncontrolled parasitic gates participate in the depletion of the two-dimensional electron gas and therefore degrade its performance.

One known way of decreasing trapping of electrons is to insert a buried barrier layer between the layers forming the heterojunction and the substrate or buffer layer of the transistor. The document published by Yu et al. entitled 'improvement of breakdown characteristics in AlGaN/GaN/ $Al_xGaN$ HEMT based on a grading $Al_xGa_{1-x}N$ buffer layer' in the review Physica Status Solidi A 207, No. 11, 2593-2596/DOI 10.1002/pssa.201026270, describes a heterojunction transistor in which conduction is horizontal. The transistor comprises a stack of a layer of GaN and of a layer of AlN and of AlGaN, at the interface of which a two-dimensional electron gas is formed. A buried barrier layer made of $Al_xGaN$ is formed under the layer of GaN. This buried barrier layer thus separates the layer of GaN from a buffer layer made of AlN. Such a buried barrier layer forms a potential barrier in the conduction band, under the quantum well containing the electron gas. Thus, for an electron present in the two-dimensional electron gas, a potential barrier of more than 3 eV is formed, thus limiting their injection into deeper layers. Such a structure makes it possible not only to increase the confinement of the carriers in the quantum well, and thus to achieve an increased threshold, but also to decrease their injection into deep layers, and thus to decrease current collapse, and to furthermore increase the breakdown voltage of the transistor.

Such a buried barrier layer may however, because of its design or doping, trap carriers and participate in the depletion of the quantum well.

The invention aims to solve one or more of these drawbacks. The invention thus relates to an electronic component, such as defined in the appended claims.

The invention also relates to the variants of the dependent claims. Those skilled in the art will understand that each of the features of the variants of the dependent claims or of the description may be combined independently with the features of an independent claim, without however constituting an intermediate generalization.

Figure 1:
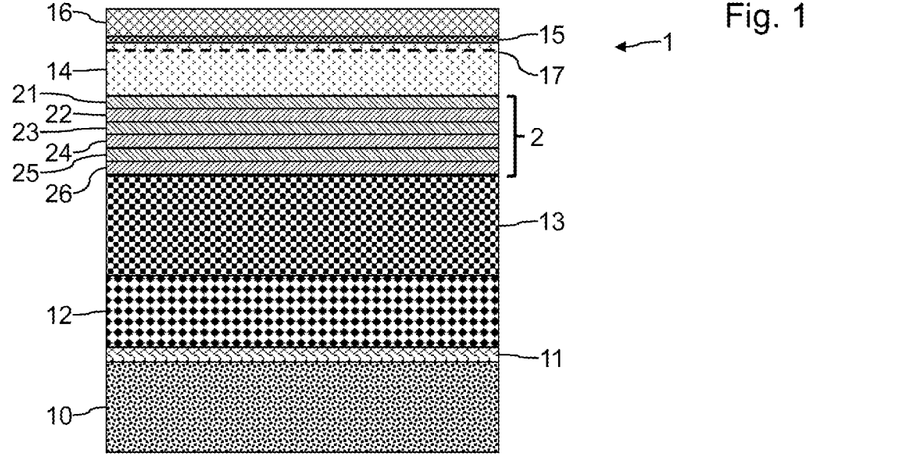
FIG. 1 is a schematic cross-sectional view of a stack of semiconductor layers for forming an electronic component equipped with a barrier layer according to a first embodiment.

Other features and advantages of the invention will become more clearly apparent from the completely non-limiting description that is given thereof below, by way of indication, with reference to the appended drawings, in which:

FIG. 1 is a schematic cross-sectional view of a stack 1 of semiconductor layers for forming an electronic component equipped with a barrier layer according to a first embodiment.

The semiconductor stack 1 contains, from bottom to top: a substrate 10, optionally one or more nucleation layers 11, optionally one or more transition layers 12, a semiconductor buffer layer 13, a buried barrier 2, a semiconductor channel layer 14, optionally a matching layer 15, and a semiconductor top layer 16.

The semiconductor layers 14 and 16 are superposed in a way known per se to form a two-dimensional electron gas 17 at the interface or near the interface between these layers 14 and 16.

The substrate 10 may be an insulator or a semiconductor such as intrinsic or doped silicon. The substrate 10 will possibly for example be silicon of (111) crystal orientation. The substrate 10 may also be silicon carbide, or sapphire. The substrate 10 may have a thickness of about 650 μm, and typically a thickness comprised between 500 μm and 2 mm.

The nucleation layer 11 is typically made of semiconductor, a III-N semiconductor for example, AlN for example, in order to allow subsequent epitaxy of a III-N semiconductor above the substrate 10.

The transition layer 12, which is deposited in a way known per se, on the nucleation layer 11 serves as an intermediary between the AlN and another III-N semiconductor. The transition layer 12 notably allows lattice matching between the AlN of the layer 11 and the layer 13 (which is typically made of GaN). Such lattice matching allows mechanical stresses in the layers to be managed. The transition layer (or layers) 12 may typically be made of a ternary aluminum-nitride alloy such as an AlGaN alloy.

The buffer layer 13 typically has a thickness comprised between 100 nm and 5 μm, typically 1 μm. Such a layer is for example a layer made of unintentionally doped GaN, or of GaN doped with carbon so as to make it more insulating.

The semiconductor layer 14 (which is for example made of a III-V semiconductor, for example of a III-N semiconductor, and typically of GaN) for example has a thickness comprised between 30 and 500 nm, for example of 100 nm. The matching layer 15 is typically made of AlN, with for example a thickness typically comprised between 0.5 nm and 1.5 nm.

The semiconductor layer 16 is made of a semiconductor other than that of the layer 14 (for example a III-V semiconductor, for example a III-N ternary semiconductor, and typically AlGaN or InAlN) and for example has a thickness comprised between 10 and 40 nm, 25 nm for example. The material of the layer 16 is chosen to have a bandgap wider than that of the GaN.

In the examples, the layers are deposited by epitaxy with a Ga-face orientation.

The buried barrier 2 comprises an alternation:
of semiconductor layers 21, 23 and 25 made of III-N ternary alloy having a concentration of one of the components of the alloy that increases with decreasing distance from the substrate 10 (i.e., with depth), or in other words a concentration that increases with depth in the layer; and
of semiconductor layers 22, 24 and 26 made of III-N ternary alloy having a concentration of one of the components of the alloy that decreases with decreasing distance from the substrate 10 (i.e., with depth), or in other words a concentration that decreases with depth in the layer.

The layers 21 to 26 are for example made of AlGaN, but it is also possible to envision other materials such as InAlN or even InAlGaN. In the illustrated example, an alternation of three layers in which the concentration of one of the components of the alloy increases, and of three layers in which the concentration of one of the components of the alloy decreases. A different number of such layers may of course be used in the buried barrier 2.

The chemical bonds of the III-N materials form dipoles because of the offset of the centroids of the positive and negative charges of the bond. Whereas these dipoles cancel one another out pairwise in the bulk of a III-N layer of uniform composition, according to the invention, volume polarization charges are generated because of the continuous variation in composition in the buried barrier 2.

With the alternation of semiconductor layers of ternary III-N alloys having a concentration of one of the materials of the alloy that increases/decreases, a multilayer is produced the layers of which respectively accumulate negative and positive volume polarization charges, respectively. Thus, a multilayer of junctions able to be qualified back-to-back p-n junctions is formed, without extrinsic doping. This multilayer of p-n junctions has a tendency to block electrons independently of polarization direction. Because there is no need for extrinsic doping, there is no need to manage doping profiles and there is no risk of extrinsic contamination of the active layers of the electronic component, and parasitic lateral conduction is avoided because the buried barrier is depleted. The idea is therefore to produce a multilayer of junctions forming potential barriers the height of which is adjustable with the composition gradient, the multilayer and its junctions being able to be dimensioned to avoid any accumulation of carriers, and in particular electrons, in the multilayer. For example, with a Ga-face III-N crystal with a satisfactory orientation of Al gradients in layers 21 to 26 made of $Al_xGa_{1-x}N$, it is possible to produce such a multilayer of back-to-back p-n junctions.

Such a buried barrier 2 preferably has a thickness at least equal to 100 nm, and advantageously at least equal to 200 nm, making it more difficult to inject and trap majority carriers in deep layers (the buffer layer 13 for example).

The barrier 2 is advantageously bonded directly to the back side of the layer 14.

With a buried barrier 2 configured in such a way, said barrier forms a high potential barrier under the two-dimensional electron gas 17, decreasing current collapse, one of the components of which is due to electrons injected into deep layers (with for example a potential barrier higher than 1 eV). Moreover, such a buried barrier 2 may be fully depleted in order to avoid any parasitic lateral conduction under the two-dimensional electron gas 17. The potential barrier may be kept at a relatively high level (for example at most 2 eV) without the buried barrier 2 inducing an excessive depletion of the two-dimensional electron gas 17. In particular, even with a layer 14 of small thickness (typically at most 50 nm), the confinement of the two-dimensional electron gas 17 is improved and the depletion in the channel layer 14 due to this barrier 2 is particularly small. In particular, such a buried barrier 2 proves to be particularly advantageous with a buffer layer 13 made of carbon-doped GaN, which has a tendency to trap electrons.

Figure 2:
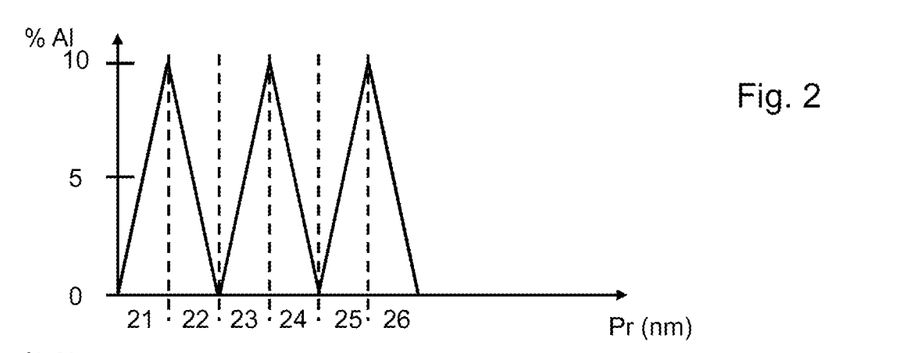
FIG. 2 is a graph showing the concentration of a chemical component through the thickness of a barrier layer according to a first variant.

It is possible, for example, to modulate the aluminum concentration in the various layers of the buried barrier 2. In particular, according to one variant, the aluminum concentration may see an alternation of layers having an aluminum concentration exhibiting a linear increase with thickness and of layers having an aluminum concentration exhibiting a linear decrease with thickness, as illustrated in the graph of FIG. 2.

Figure 3:
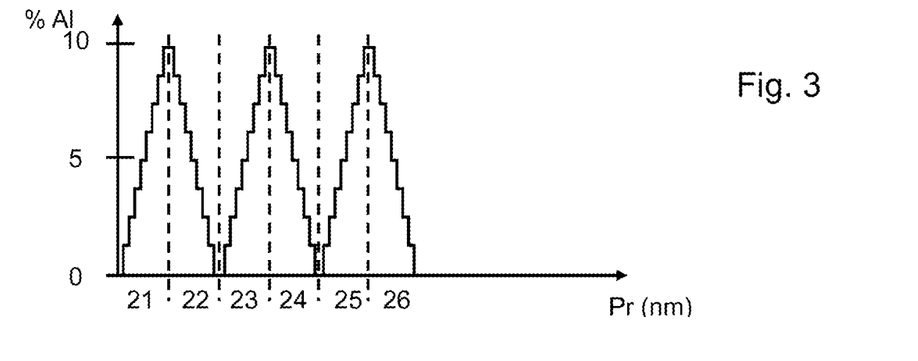
FIG. 3 is a graph showing the concentration of a chemical component through the thickness of a barrier layer according to a second variant.

In another variant, the aluminum concentration may see an alternation of layers having an aluminum concentration exhibiting a stepped increase with thickness and of layers having an aluminum concentration exhibiting a stepped decrease with thickness, as illustrated in the graph of FIG. 3.

Various configurations of the layers of the buried barrier 2 will be detailed below.

Figure 4:
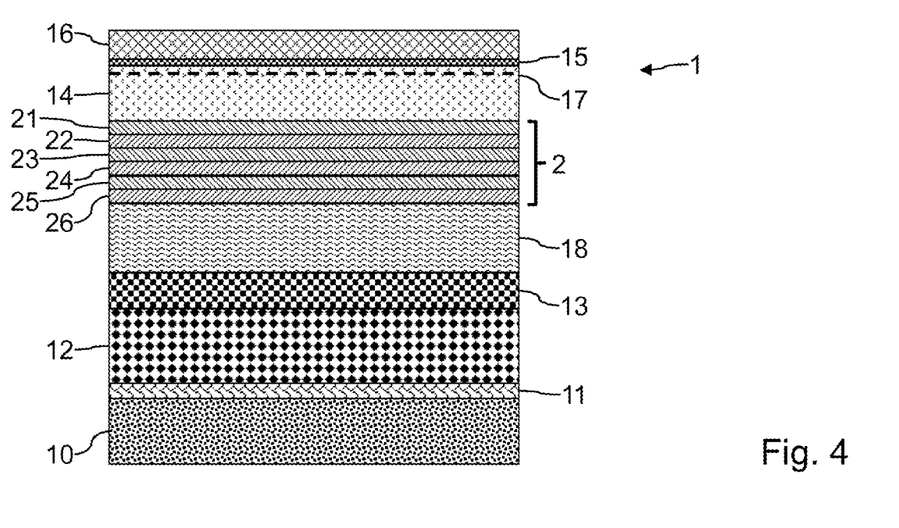
FIG. 4 is a schematic cross-sectional view of a stack of semiconductor layers for forming an electronic component equipped with a barrier layer according to a second embodiment.

FIG. 4 is a schematic cross-sectional view of a stack 1 of semiconductor layers for forming an electronic component equipped with a barrier layer according to a second embodiment.

The stack 1 of the second embodiment has the same configuration as the stack of the first embodiment, and differs therefrom only in the presence of a layer 18 of p-doped semiconductor, which layer is interposed between the buffer layer 13 and the buried barrier 2. The layer 18 is here made of p-doped GaN. The layer 18 may for example be p-doped with an acceptor concentration comprised between $5 \times 10^{16}$ cm$^{-3}$ and $5 \times 10^{17}$ cm$^{-3}$, and for example of $10^{17}$ cm$^{-3}$. The p-doping will possibly be achieved with magnesium.

The layer 18 may for example have a thickness comprised between 50 and 250 nm, and for example of 200 nm.

Such a configuration allows an additional potential barrier to be created under the buried barrier 2, and also allows complete depletion of electrons from the buried barrier 2 to be promoted. The larger the thickness of the layer 18, the higher the potential barrier provided thereby. Such a layer 18 may also be used to compensate for electrons that could accumulate at the bottom of the buffer layer 13.

The influence of various parameters on the operation of the buried barrier 2 will be studied. Thus, simulations have been carried out with various configurations of the second embodiment. The layer 14 is here made of GaN, the layer 16 of AlGaN, and the layers 21 to 26 are made of AlGaN.

Figure 5:
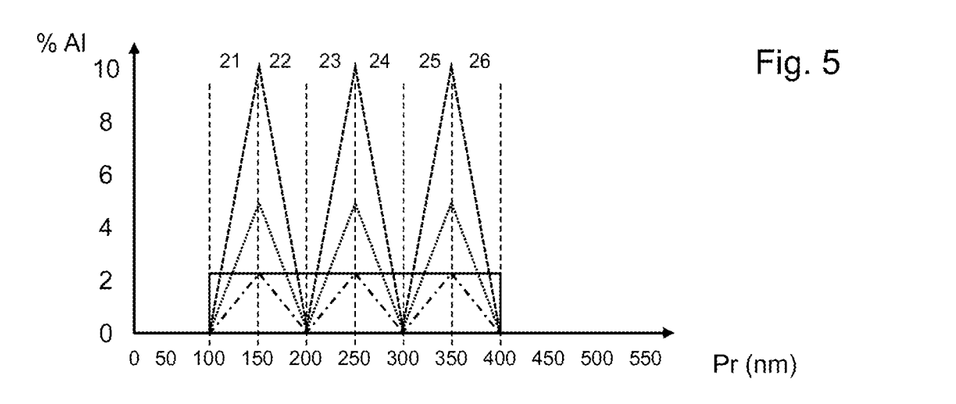
FIG. 5 is a graph illustrating various concentrations of a chemical component in the alloy layers of the buried barrier for various configurations, as a function of depth.
Figure 6:
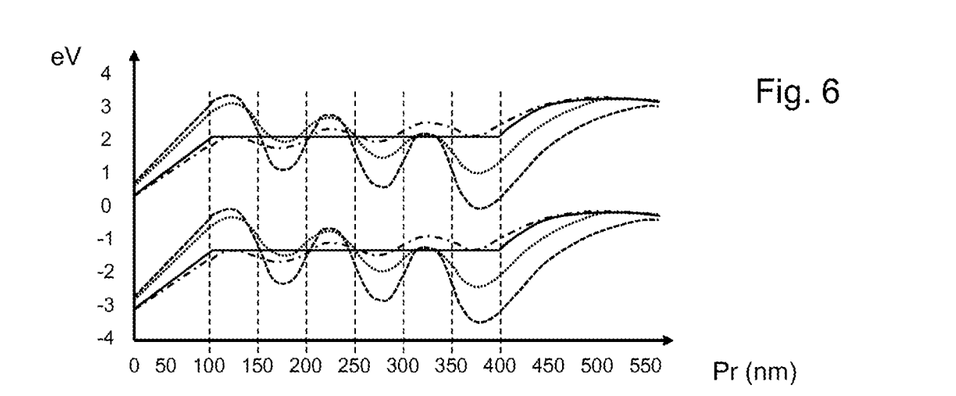
FIG. 6 is a graph illustrating the valence- and conduction-band energies for the various configurations of FIG. 5, as a function of depth.
Figure 7:
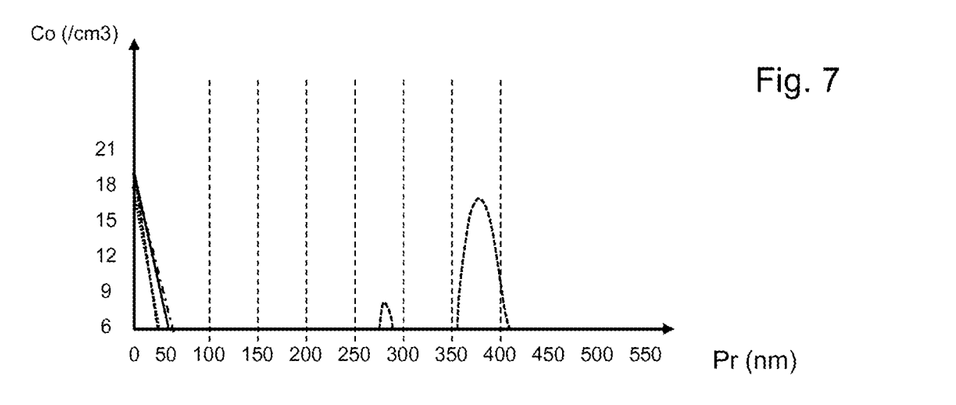
FIG. 7 is a graph illustrating the decimal logarithm of the electron concentration for the various configurations of FIG. 5, as a function of depth.

FIG. 5 is a graph illustrating various concentrations of a chemical component in the alloy layers of the buried barrier for various configurations, as a function of depth. FIG. 6 is a graph illustrating valence- and conduction-band energies as a function of depth, for the various configurations of FIG. 5. FIG. 7 is a graph illustrating electron concentration as a function of depth, for the various configurations of FIG. 5.

The depth zero in the graphs corresponds to the top side of the GaN layer 14. This layer 14 here has a thickness of 100 nm in the various configurations.

The solid curves correspond to a prior-art configuration, with a buried barrier consisting of an AlGaN layer having a uniform concentration of 2.5% right through its thickness (300 nm).

The dot-dashed curves correspond to a configuration with layers 21, 23 and 25 the aluminum concentration of which increases linearly between 0 and 2.5%, through their thickness, with decreasing distance from the substrate 10, and with layers 22, 24 and 26 the aluminum concentration of which decreases linearly between 2.5% and 0%, through their thickness, with decreasing distance from the substrate 10.

The dotted curves correspond to a configuration with layers 21, 23 and 25 the aluminum concentration of which increases linearly between 0 and 5%, through their thickness, with decreasing distance from the substrate 10, and with layers 22, 24 and 26 the aluminum concentration of which decreases linearly between 5% and 0%, through their thickness, with decreasing distance from the substrate 10.

The dashed curves correspond to a configuration with layers 21, 23 and 25 the aluminum concentration of which increases linearly between 0 and 10%, through their thickness, with decreasing distance from the substrate 10, and with layers 22, 24 and 26 the aluminum concentration of which decreases linearly between 10% and 0%, through their thickness, with decreasing distance from the substrate 10.

In the various configurations according to the invention, the layers 21 to 26 have respective thicknesses of 50 nm.

As illustrated in FIG. 6, the various configurations according to the invention allow a relatively high conduction-band energy to be achieved, notably with a potential barrier at least equal to 2 eV in the top portion of the buried barrier. The configuration illustrated by the dot-dashed lines notably allows a potential-barrier value of about 2 eV to be achieved, in the top portion of the buried barrier. Such a configuration also allows a relatively high potential-barrier value to be maintained right through the thickness of the buried barrier, this promoting complete electron depletion thereof. Thus, it is possible either to keep a high average concentration of the chosen alloy material (here aluminum) to maximize the potential barrier, or to decrease the average concentration of this material to maintain the level of the potential barrier, while promoting epitaxial growth of the layers of the buried barrier: a lower concentration of the chosen material allows mechanical stresses related to differences in the lattice parameters of the variable-composition ternary alloy to be decreased.

As illustrated in FIG. 7, the various configurations allow a high electron concentration to be preserved in the two-dimensional electron gas 17. The buried barrier according to the invention thus disrupts the two-dimensional electron gas 17 little. Moreover, only the configuration according to the invention corresponding to the dashed curve causes a notable electron concentration to appear in the buried barrier. For the other configurations according to the invention, the electron concentration in the buried barrier is very low, or indeed the buried barrier is fully depleted. Advantageously, the minimum aluminum concentration in the layers 21 to 26 is at most equal to 1%. Advantageously, the maximum aluminum concentration in the layers 21 to 26 is at least equal to 2%, and preferably at most equal to 10%, and advantageously at most 5%.

Advantageously, the product of the maximum aluminum concentration of one of the layers 21 to 26 multiplied by its thickness is comprised between $1 \times 10^{-9}$ m and $3 \times 10^{-9}$ m. Such a range promotes complete depletion of the buried barrier 2.

Figure 8:
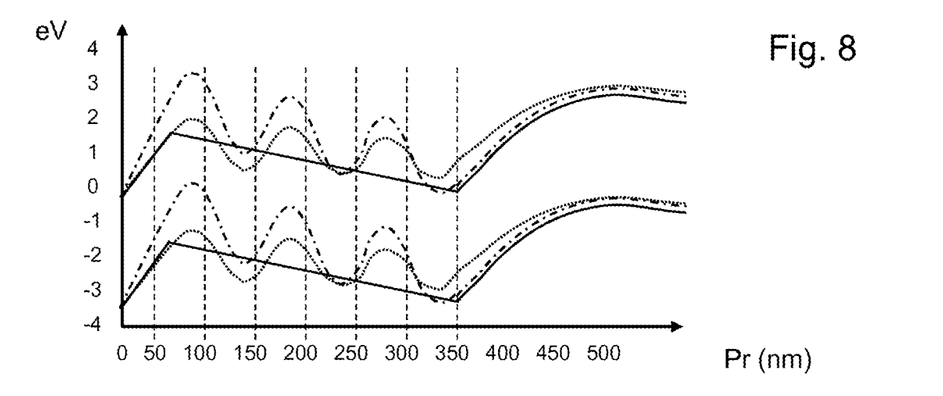
FIG. 8 is a graph illustrating valence- and conduction-hand energies for other configurations, as a function of depth.
Figure 9:
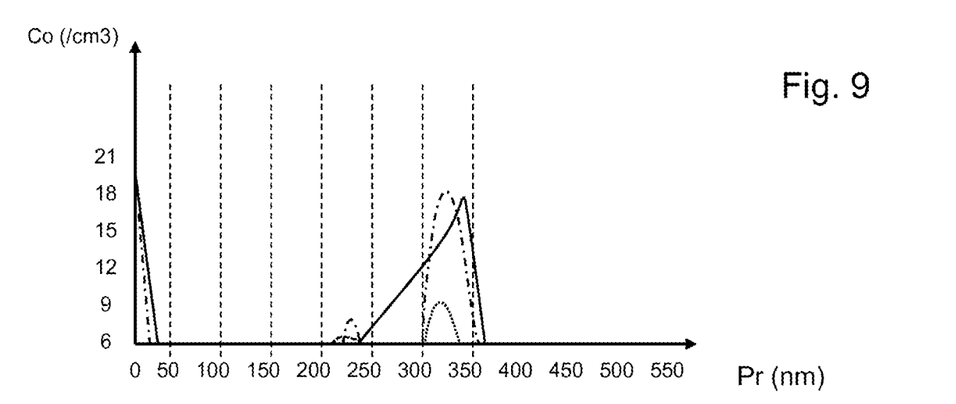
FIG. 9 is a graph illustrating the decimal logarithm of electron concentration for the configurations of FIG. 8, as a function of depth.

FIG. 8 is a graph illustrating the valence- and conduction-band energies as a function of depth for another configuration according to the invention. FIG. 9 is a graph illustrating the electron concentration as a function of depth, for the configuration according to the invention of FIG. 8. The solid curve corresponds to a reference prior-art configuration, with a buried barrier made of AlGaN having a uniform aluminum concentration of 5%. The dot-dashed curve corresponds to a configuration with layers 21 to 26 having aluminum concentrations varying between 0 and 10%, with an average concentration of 5%. The dotted curve corresponds to a configuration with layers 21 to 26 having aluminum concentrations varying between 0 and 5%, with an average concentration of 2.5%.

The zero depth in the graphs corresponds to the top side of the GaN layer 14. With respect to the configurations of FIG. 5, the layer 14 here has a thickness of 50 nm. The layer 14 is therefore thinner than in the configurations of FIG. 5. The buried barrier for the two configurations illustrated in FIG. 8 has a thickness of 300 nm. From the graph of FIG. 8 it may be seen that, for the same average amount of aluminum as in the prior art, a configuration according to the invention allows the level of the barrier to be increased by 1.6 eV. It may also be seen that, for an average amount half less than in the prior art, a configuration according to the invention allows the barrier to be kept at the same level.

From the graph of FIG. 9 it is possible to deduce that, for the same average amount of aluminum as in the prior art, a configuration according to the invention allows the same electron concentration to be achieved. It may also be seen that, for an average amount half less than in the prior art, a configuration according to the invention almost makes it possible to obtain a depletion of electrons under the two-dimensional electron gas 17. Such a barrier then disrupts the two-dimensional electron gas 17 little.

Figure 10:
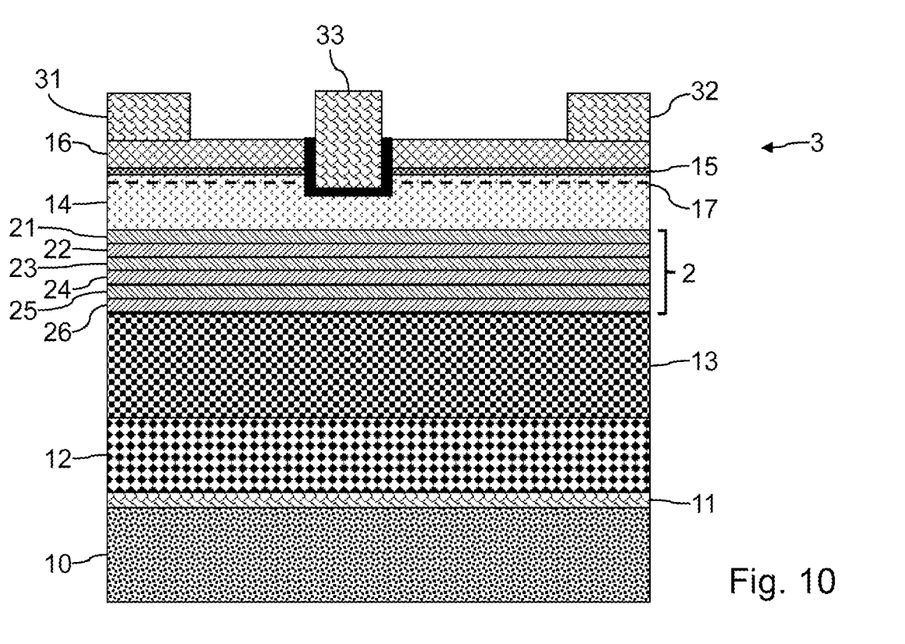
FIG. 10 is a schematic cross-sectional view of an application of the first embodiment to an enhancement-mode high-electron-mobility field-effect transistor.

Such a semiconductor stack 1 including a buried barrier 2 may be used in many types of electronic components. Such a stack 1 may notably be used to form electronic components in which conduction is horizontal. With reference to FIG. 10, the application of such a stack 1 to forming a high-electron-mobility field-effect transistor 3 in which the conduction is horizontal is illustrated.

The transistor 3 comprises, in a way known per se, conduction electrodes 31 and 32 placed on the semiconductor layer 16. One of these electrodes will be designated the source, and the other electrode will be designated the drain of the transistor 3. A control gate 33 is positioned between the conduction electrodes 31 and 32. The control gate 33 is here formed in a recess that passes through the layer 16. The transistor 3 is therefore here a normally off transistor. In the on-state, the conduction under the gate 33 is of MOS type, in the layer 14. The source 31, the drain 32 and the control gate 33 are merely illustrated schematically, their dimensions and their structures possibly differing greatly from the illustration of FIG. 5.

The application of the invention to such a transistor 3 notably allows its threshold voltage to be shifted toward positive values by virtue of the enhanced confinement of the electrons of the layer 17. The on-state resistance of such a transistor 3 is particularly low under the gate, for a recessed normally off transistor. Specifically, the buried barrier 2 is close to the two-dimensional electron gas 17, this allowing the depth of the gate recess to be decreased. Moreover, the static disorder under the gate 33, in the absence of extrinsic doping that could potentially contaminate the MOS channel formed in the on-state, is also decreased.

The invention claimed is:

1. An electronic component, comprising:
a substrate;
a stack of two layers of different semiconductors, the two layers being configured to form a two-dimensional electron gas at or near their interface, the stack having:
a channel layer made of a III-N semiconductor, and
a top layer made of a III-N ternary semiconductor; and
a buried barrier forming a separation between the substrate and the stack,
wherein the buried barrier comprises:
a first layer of a ternary III-N semiconductor alloy having a concentration of aluminum that increases with decreasing distance from the substrate, the first layer having an average concentration of aluminum at most equal to 5%, a minimum aluminum concentration at most equal to 1%, and a maximum aluminum concentration at least equal to 2%, and
a second layer of a ternary III-N semiconductor alloy being formed under the first layer and having a concentration of aluminum that decreases with decreasing distance from the substrate, the second layer having an average concentration of aluminum at most equal to 5%.

2. The electronic component as claimed in claim 1, wherein the maximum aluminum concentration in the first layer is at most 5%.

3. The electronic component as claimed in claim 1, wherein the first and second layers are made of AlGaN.

4. The electronic component as claimed in claim 3, wherein a product of a maximum aluminum concentration of the first layer multiplied by its thickness is comprised between $1 \times 10^{-9}$ m and $3 \times 10^{-9}$ m.

5. The electronic component as claimed in claim 1, wherein the first and second layers are unintentionally doped.

6. The electronic component as claimed in claim 1, wherein the buried barrier has a thickness at least equal to 100 nm.

7. The electronic component as claimed in claim 1, wherein the buried barrier comprises an alternation of a plurality of first and second layers.

8. The electronic component as claimed in claim 6, wherein the first and second layers each have a thickness at most equal to 60 nm.

9. The electronic component as claimed in claim 1, wherein the first and second layers are sufficiently thin to not accumulate electrons in the buried barrier.

10. The electronic component as claimed in claim 1, wherein the buried barrier makes contact with the stack of the two semiconductor layers forming the two-dimensional electron gas.

11. The electronic component as claimed in claim 1, furthermore comprising a p-doped semiconductor layer placed between the buried barrier and the substrate.

12. An electronic component, comprising:
a substrate;
a stack of two layers of different semiconductors, the layers being configured to form a two-dimensional electron gas at or near their interface; and
a buried barrier forming a separation between the substrate and the stack;
wherein
the buried barrier comprises a plurality of first layers of a ternary III-N semiconductor alloy having a concentration of one of the chemical species of the ternary alloy that increases with decreasing distance from the substrate alternately arranged with a plurality of second layers of a ternary III-N semiconductor alloy and having a concentration of the one of the chemical species of the ternary alloy that decreases with decreasing distance from the substrate, and
a minimum concentration of the chemical species in each of the first and second layers is at most 1% and a maximum concentration of the chemical species in each of the first and second layers is at most 10%
the minimum concentration of the chemical species in each of the first and second layers is the same, and the maximum concentration of the chemical species in each of the first and second layers is the same.

13. The electronic component as claimed in claim 12, furthermore comprising a p-doped semiconductor layer placed between the buried barrier and a C-doped buffer layer, wherein the p-doped semiconductor layer is in physical contact with the C-doped buffer layer.

14. The electronic component as claimed in claim 1, furthermore comprising a p-doped semiconductor layer placed between the buried barrier and the substrate, the p-doped semiconductor layer having a doping concentration between $5 \times 10^{16}$ cm$^{-3}$ and $5 \times 10^{17}$ cm$^{-3}$.

15. The electronic component as claimed in claim 12, wherein the maximum concentration of the chemical species in the first and second layers is at most 5%.

16. The electronic component as claimed in claim 1, wherein the maximum concentration of aluminum in the first and second layers is about 2%.

17. The electronic component as claimed in claim 1, wherein
- the barrier comprises a plurality of the first and second layers alternately arranged, and
- the minimum concentration of aluminum in each of the first and second layers is the same, and the maximum concentration of aluminum in each of the first and second layers is the same.

* * * * *